(12) United States Patent  
Mishra et al.

(10) Patent No.: US 9,419,082 B2  
(45) Date of Patent: Aug. 16, 2016

(54) SOURCE/DRAIN PROFILE ENGINEERING FOR ENHANCED P-MOSFET

(71) Applicant: GLOBALFOUNDRIES Inc., Grand Cayman (KY)

(72) Inventors: Shiv Kumar Mishra, Clifton Park, NY (US); Zhiqing Li, Clifton Park, NY (US); Scott Beasor, Greenwich, NY (US); Shesh Mani Pandey, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 14/259,726

(22) Filed: Apr. 23, 2014

(65) Prior Publication Data

US 2015/0311293 A1    Oct. 29, 2015

(51) Int. Cl.
| | |
|---|---|
| *H01L 21/22* | (2006.01) |
| *H01L 29/36* | (2006.01) |
| *H01L 29/16* | (2006.01) |
| *H01L 29/78* | (2006.01) |
| *H01L 21/02* | (2006.01) |
| *H01L 29/66* | (2006.01) |

(52) U.S. Cl.
CPC ........ *H01L 29/365* (2013.01); *H01L 21/02532* (2013.01); *H01L 21/02579* (2013.01); *H01L 29/16* (2013.01); *H01L 29/66477* (2013.01); *H01L 29/78* (2013.01)

(58) Field of Classification Search
CPC ................ H01L 21/823807; H01L 21/823814
USPC .................. 438/442, 429, 418, 413, 510, 542
See application file for complete search history.

(56) References Cited

U.S. PATENT DOCUMENTS

| | | | |
|---|---|---|---|
| 6,855,963 B1* | 2/2005 | Chu | H01L 29/78687 257/E29.056 |
| 7,935,612 B1 | 5/2011 | Bedell et al. | |
| 2007/0235802 A1* | 10/2007 | Chong | H01L 21/823807 257/346 |
| 2010/0200937 A1 | 8/2010 | Bedell et al. | |
| 2012/0086077 A1* | 4/2012 | Fried | H01L 21/26586 257/347 |
| 2012/0153399 A1* | 6/2012 | Hoentschel | H01L 21/823814 257/369 |

* cited by examiner

*Primary Examiner* — Julia Slutsker  
(74) *Attorney, Agent, or Firm* — Heslin Rothenberg Farley & Mesiti P.C.

(57) ABSTRACT

P-type metal-oxide semiconductor field-effect transistors (pMOSFET's), semiconductor devices comprising the pMOSFET's, and methods of forming pMOSFET's are provided. The pMOSFET's include a silicon-germanium (SiGe) film that has a lower interface in contact with a semiconductor substrate and an upper surface, and the SiGe film has a graded boron doping profile where boron content increases upwardly over a majority of the width of boron-doped SiGe film between the lower interface of the SiGe film and the upper surface of the SiGe film. Methods of forming the pMOSFET's include: providing a semiconductor substrate; depositing a SiGe film on the semiconductor substrate, thereby forming a lower interface of the SiGe film in contact with the semiconductor substrate, and an upper surface of the SiGe film; and doping the SiGe film with boron to form a SiGe film having a graded boron doping profile where boron content increases upwardly over a majority of the width of boron-doped SiGe film between the lower interface of the SiGe film and the upper surface of the SiGe film.

5 Claims, 15 Drawing Sheets

SOURCE/DRAIN PROFILE ENGINEERING FOR ENHANCED P-MOSFET

FIELD OF THE INVENTION

The present invention generally relates to p-type metal-oxide semiconductor field-effect transistors (pMOSFET's), to semiconductor devices that include the pMOSFET's, and to methods of forming pMOSFET's.

BACKGROUND OF THE INVENTION

Integrated circuits are formed from semiconductor substrates within and upon whose surfaces may be formed resistors, transistors, diodes and other electrical circuit elements. As described by Moore's law, the semiconductor industry drives down pattern dimensions in order to reduce transistor size and enhance processor speed at a rapid pace.

As devices scale smaller, shrinking design and demand for doping in the source/drain in p-type MOSFET's lead to increased overlap capacitance. Since high overlap capacitance compromises device alternating current (AC) performance, the scaling of semiconductor devices and components, such as MOSFET's, presents a challenge to fabricating high-quality nano/micron-scale components with good electrical performance.

Thus, a need exists for improved pMOSFET's, for methods of forming the same, and for semiconductor devices incorporating the same.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

In this specification, where a document, act or item of knowledge is referred to or discussed, this reference or discussion is not an admission that the document, act or item of knowledge or any combination thereof was, at the priority date, publicly available, known to the public, part of common general knowledge, or otherwise constitutes prior art under the applicable statutory provisions; or is known to be relevant to an attempt to solve any problem with which this specification is concerned.

SUMMARY OF THE INVENTION

Briefly, the present invention satisfies the need for improved pMOSFET's, for methods of forming the same, and for semiconductor devices incorporating the same.

The present invention provides, in one aspect, a method of forming a p-type metal-oxide semiconductor field-effect transistor (pMOSFET), which method includes:
 providing a semiconductor substrate;
 depositing a silicon-germanium (SiGe) film on the semiconductor substrate, thereby forming a lower interface of the SiGe film in contact with the semiconductor substrate, and an upper surface of the SiGe film; and
 doping the SiGe film with boron to form a SiGe film having a graded boron doping profile where boron content increases upwardly over a majority of the width of boron-doped SiGe film between the lower interface of the SiGe film and the upper surface of the SiGe film.

The invention provides, in another aspect, a pMOSFET, which includes a SiGe film, said SiGe film having a lower interface in contact with a semiconductor substrate and an upper surface, and said SiGe film having a graded boron doping profile where boron content increases upwardly over a majority of the width of boron-doped SiGe film between the lower interface of the SiGe film and the upper surface of the SiGe film.

The present invention provides, in another aspect, a semiconductor device which includes the inventive pMOSFET.

The present invention may address one or more of the problems and deficiencies of the art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

Certain embodiments of the presently-disclosed pMOSFET, semiconductor device including the pMOSFET, and method of forming the pMOSFET have several features, no single one of which is solely responsible for their desirable attributes. Without limiting the scope of these methods as defined by the claims that follow, their more prominent features will now be discussed briefly. After considering this discussion, and particularly after reading the section of this specification entitled "Detailed Description of the Invention," one will understand how the features of the various embodiments disclosed herein provide a number of advantages over the current state of the art. These advantages may include, without limitation, providing devices and methods that offer reduced overlap capacitance, reduced junction leakage, and/or good overall electrical performance.

These and other features and advantages of this invention will become apparent from the following detailed description of the various aspects of the invention taken in conjunction with the appended claims and the accompanying drawings.

DETAILED DESCRIPTION OF THE INVENTION

Figure 1A:
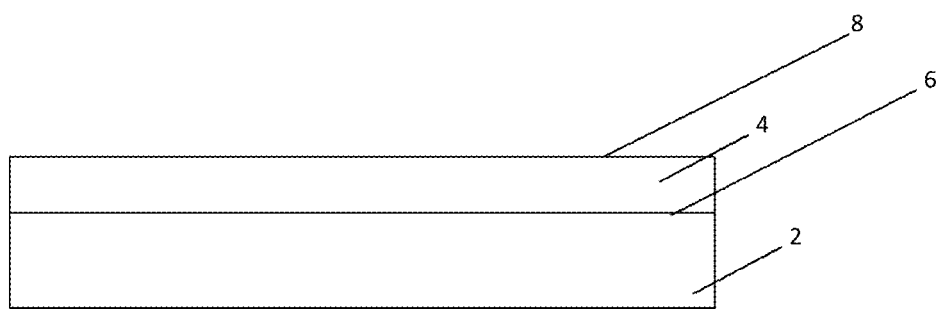
FIGS. 1A-B are pictorial representations, through cross-sectional views, depicting embodiments of boron doped SiGe film on semiconductor substrate.

The present invention is generally directed to a pMOSFET, to a semiconductor device that includes the pMOSFET, and to a method of forming a pMOSFET.

Although this invention is susceptible to embodiment in many different forms, certain embodiments of the invention are shown and described. It should be understood, however, that the present disclosure is to be considered as an exemplification of the principles of this invention and is not intended to limit the invention to the specific embodiments discussed herein.

Prior art pMOSFET fabrication methods typically include constant boron doping of the SiGe film. Thus, constant boron doping of the SiGi film may be referred to as a process of record (POR). However, it has been found that by engineering a graded boron doping profile for the SiGe, overlap capacitance is decreased and AC performance is thereby improved, without noting any adverse affect on other aspects of device performance. Embodiments of the invention also reduce junction leakage.

Reference is made below to the drawings (which, for ease of understanding, are not necessarily drawn to scale), wherein the same reference numerals retain their designation and meaning for the same or like elements throughout the various drawings.

In one aspect, the invention provides a method of forming a p-type metal-oxide semiconductor field-effect transistor (pMOSFET), which method includes:
providing a semiconductor substrate;
depositing a silicon-germanium (SiGe) film on the semiconductor substrate, thereby forming a lower interface of the SiGe film in contact with the semiconductor substrate, and an upper surface of the SiGe film; and
doping the SiGe film with boron to form a SiGe film having a graded boron doping profile where boron content increases upwardly over a majority of the width of boron-doped SiGe film between the lower interface of the SiGe film and the upper surface of the SiGe film.

The semiconductor substrate may include any semiconductor material, including, but not limited to, Si, SiGe, SiGeC, SiC, Ge, Ge alloys, GaAs, InAs, InP, and other III/V or II/VI compound semiconductors. The semiconductor substrate may be doped or undoped, and may optionally contain doped and undoped regions therein.

As used herein, the term "SiGe film" (which may be used interchangeably with "silicon-germanium film") refers to a layer including silicon-germanium (SiGe), which is a general term for the alloy $Si_{1-x}Ge_x$, which consists of any molar ratio of silicon and germanium.

In some embodiments of the invention, "depositing" a SiGe film refers to forming the SiGe film via epitaxial growth. The as-deposited SiGe film may have a uniform thickness. Epitaxial growth processes are known in the art. Emphasis herein is placed on the steps and attributes of the inventive product and method, and not on well-known process of record (POR) semiconductor processing steps, which may be used together with the present invention.

In some embodiments, the inventive methods include depositing a SiGe film having a thickness of 10 to 200 nm. For example, in some embodiments, the film has a thickness of 10, 20, 30, 40, 50, 60, 70, 80, 90, 100, 110, 120, 130, 140, 150, 160, 170, 180, 190, or 200 nm, including any and all ranges and subranges therein (e.g., 10-100 nm, 20-60 nm, 25-50 nm, etc.).

As used herein, the term "lower interface of the SiGe film" refers to the interface between the SiGe film and the underlying semiconductor substrate on which the SiGe film is deposited. The term "upper surface of the SiGe film" refers to the SiGe film surface that is opposite the lower interface of the SiGe film. FIG. 1A is a pictorial representation, through cross-sectional view, depicting the lower interface 6 of the SiGe film 4 where it contacts semiconductor substrate 2 and the upper surface 8 of the SiGe film 4 according to an embodiment of the invention. In the embodiment shown in FIG. 1A, the lower interface 6 of the SiGe film 4 is in contact with the active area of the semiconductor substrate 2. For ease of reference, other areas of the substrate (e.g., isolation regions) are not pictured.

When reference is made herein to a SiGe film having a "graded boron doping profile," said profile has an increasing gradient reflecting increasing boron content (concentration) as the gradient progresses in the direction away from the lower interface of the SiGe film and toward the upper surface of the SiGe. FIGS. 2A-D are simplified representations of non-limiting examples of graded boron doping profiles for SiGe film according to embodiments of the invention. In FIGS. 2A-D and FIG. 3, the vertical dashed line at 50 nm represents the lower interface of the SiGe film, and the Y axis (at 0 nm) represents the upper surface of the SiGe film. In some embodiments (e.g., FIG. 2A), the graded boron doping profile spans the entire thickness of the SiGe film. In other embodiments (e.g., FIGS. 2B-D), the graded boron doping profile spans less than the entire thickness of the SiGe film.

Figure 2A:
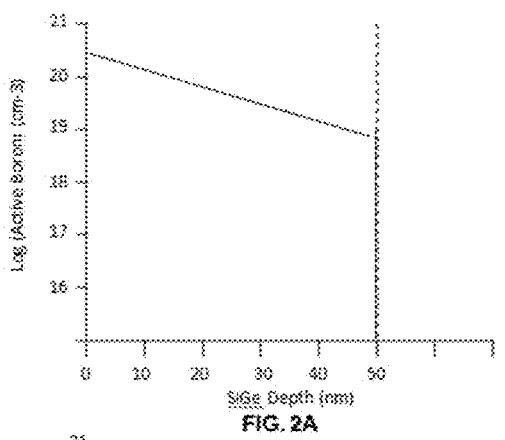
FIGS. 2A-D are representations of non-limiting examples of graded boron doping profiles for SiGe film according to embodiments of the invention.
Figure 2B:
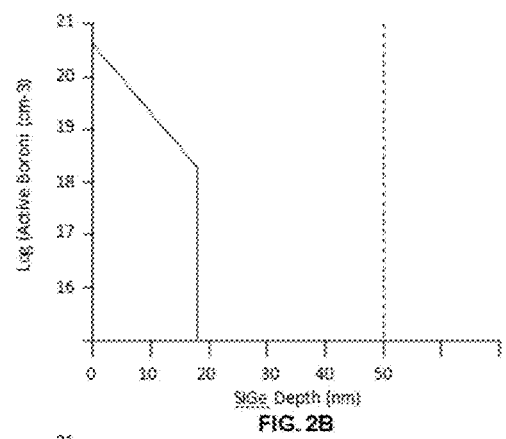
Figure 2C:
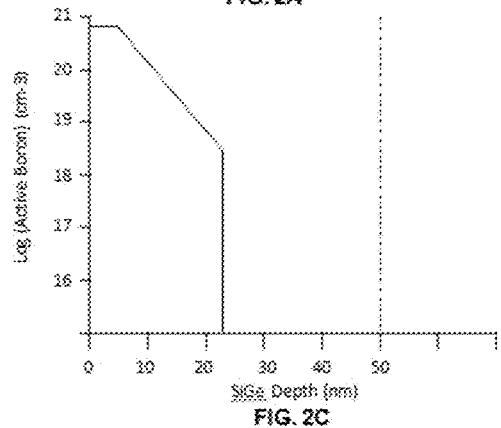
Figure 2D:
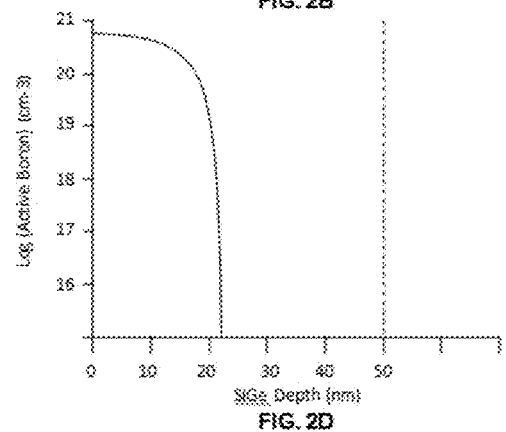

As mentioned above, the inventive method requires doping the SiGe film with boron to form a SiGe film having a graded boron doping profile where boron content increases upwardly over a majority of the width of boron-doped SiGe film between the lower interface of the SiGe film and the upper surface of the SiGe film. Accordingly, more than 50% of the boron-doped portion of the SiGe film will have a graded, non-linear, boron doping profile, reflecting that boron content is increasing upwardly in the direction toward the upper surface of the SiGe film. For example, in the embodiment represented by FIG. 2A, the entire width (50 nm) of the SiGe film is boron-doped, and the boron content increases upwardly (from the lower interface of the SiGe film at 50 nm to the upper surface of the SiGe film at 0 nm) over the entire portion (and thus over a majority) of the boron-doped SiGe film. In FIG. 2C, on the other hand, the represented SiGe film is only boron-doped from the upper surface to about 23 nm into the film. The remaining approximate 27 nm of the film are not boron-doped. Of the 23 nm of SiGe film that are boron-doped, the boron content increases upwardly over approximately 17 nm (from about 6-23 nm on the chart) of the film. Thus, the SiGe film whose profile is depicted in FIG. 2C has a graded boron doping profile where boron content increases upwardly over a majority (17 nm) of the width of boron-doped SiGe film (23 nm) between the lower interface of the SiGe film and the upper surface of the SiGe film. The profiles in FIGS. 2A-D are simplified profiles for understanding the invention. Persons having ordinary skill in the art will appreciate that during subsequent pMOSFET fabrication steps, thermal budgets may cause boron to diffuse further into the undoped region.

Figure 3:
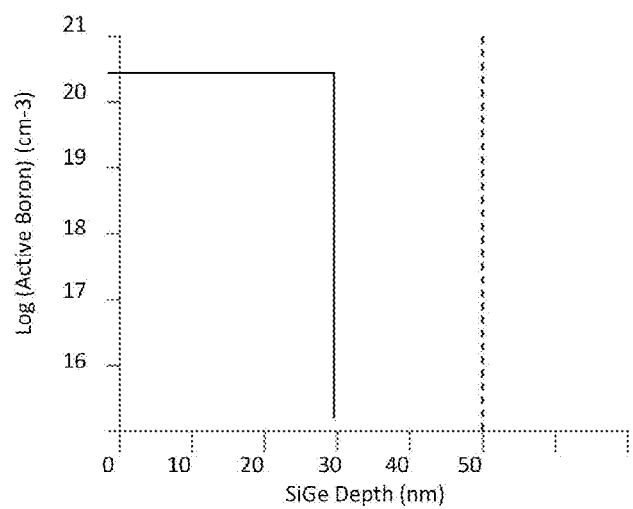
FIG. 3 is a representation of a prior art constant boron doping profile for a SiGe film.

The graded boron doping profile of the present pMOSFET and method of forming a pMOSFET differs from prior art pMOSFET's and pMOSFET fabrication processes, which typically use a constant boron doping profile. FIG. 3 is a representation of a prior art constant boron doping profile for a SiGe film. As illustrated, the SiGe film represented by FIG. 3 does not meet the graded boron doping profile element of the present invention. One of the reasons that prior art pMOSFET fabrication processes typically use constant boron doping is because increased boron content in a SiGe film is known to degrade device performance.

Figure 4:
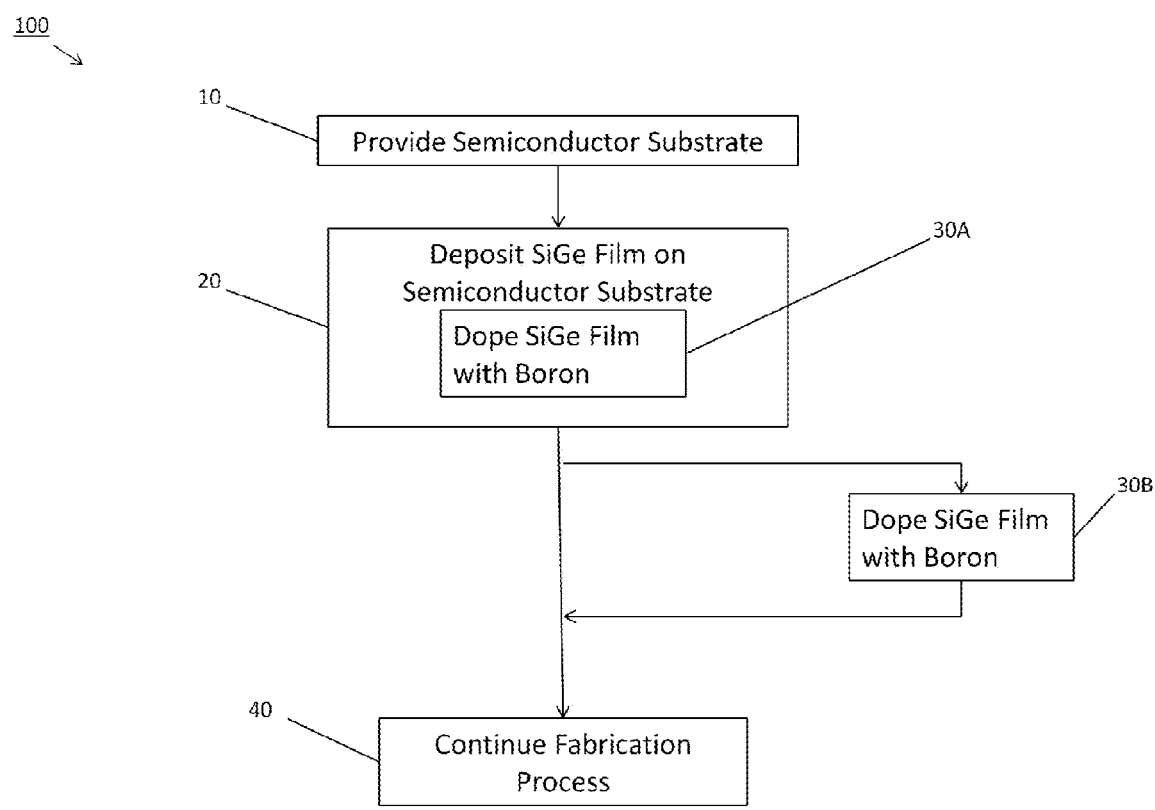
FIG. 4 depicts is a flow chart illustrating steps included in an embodiment of the inventive method of forming a pMOSFET.

Referring to FIG. 4, depicted is a flow chart illustrating steps included in an embodiment of the inventive method of forming a pMOSFET. The depicted method 100 includes a step 10 of providing a semiconductor substrate, a step 20 of depositing a SiGe film on the semiconductor substrate, and a step 30 of doping the SiGe film with boron, where, as depicted, step 30 may be performed during the depositing step 20, as shown in the case of step 30A (an in situ doping step), and/or may be performed after the depositing step 20, as shown in the case of step 30B, which may be, for example, an ion implantation step. Some embodiments of the inventive method also include further fabrication process step(s) 40.

The boron doping step (i.e., the "doping the SiGe film with boron" step) may be performed in situ, i.e., while the SiGe film is being deposited (for example, during epitaxial growth of the SiGe film), and/or ex situ, i.e., after the SiGe film is deposited.

Any known doping method may be used to dope the SiGe film with boron. In some embodiments, the SiGe film is boron-doped in situ using a boron-containing gas (e.g., diborane). In some embodiments, the graded boron doping profile of the SiGe film is achieved by controlling gas flow rate of the boron-containing gas while forming (e.g., via epitaxial growth), the SiGe film. The gas flow rate may be controlled so as to yield a SiGe film having a desired graded boron doping profile. For example, in some embodiments, the gas flow rate is controlled so as to yield a graded boron doping profile reflecting a graded boron concentration increase from $1 \times 10^{19}$ atoms of boron per cm$^3$ or less to at least $4 \times 10^{20}$ atoms of boron per cm$^3$. In some embodiments, the gas flow rate is increased logarithmically. In some embodiments, the gas flow rate is increased linearly.

In some embodiments, the SiGe film is boron-doped ex situ using a conventional doping process. For example, in some embodiments, the SiGe film is boron-doped using ion implantation, gas phase doping, or diffusion doping.

As indicated above, the boron doping step results in a SiGe film having a graded boron doping profile where boron content increases upwardly over a majority of the width of the boron-doped SiGe film. In some embodiments, the doping results in a SiGe film having a graded boron doping profile where boron content increases upwardly over 51-100% of the boron-doped SiGe film, for example, over 51, 55, 60, 65, 70, 75, 80, 85, 90, 95, or 100% of the boron-doped SiGe film, including any and all ranges and subranges therein (e.g., the boron content may increase upwardly over 60-100% of the boron-doped SiGe film).

In some embodiments, the inventive method results in a SiGe film having a graded boron doping profile where boron content increases upwardly over a span of at least 5 nm between the lower interface of the SiGe film and the upper surface of the SiGe film. In some embodiments, the boron content increases upwardly over a span of 5-100 nm between the lower interface of the SiGe film and the upper surface of the SiGe film, for example, over a span of 5, 10, 15, 20, 25, 30, 35, 40, 45, 50, 55, 60, 65, 70, 75, 80, 85, 90, 95, or 100 nm, including any and all ranges and subranges therein (e.g. 5-50 nm, 10-40 nm, etc.). In some embodiments, the SiGe film has a graded boron doping profile spanning at least 20 nm of the SiGe film.

Figure 1B:
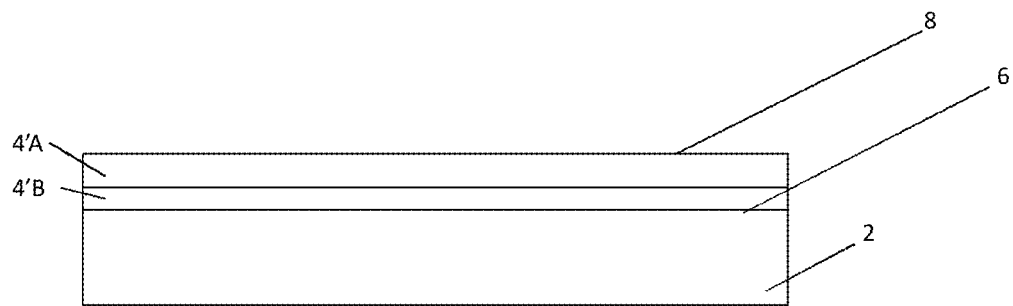

In some embodiments, the method of the invention forms a SiGe film which is made up of a lower SiGe layer (L1) adjacent to the lower interface in contact with the semiconductor substrate, and an upper SiGe layer (L2) adjacent to the upper surface of the SiGe film, where L1 is in direct contact with L2, and wherein L2 includes more boron than L1, and wherein said depositing a silicon-germanium (SiGe) film step includes forming L1, and subsequently forming L2. L1 and L2 may be continuously formed, such that both layers are formed consecutively in a single depositing process step. In some embodiments, the SiGe film consists of layers L1 and L2. FIG. 1B is a pictorial representation, through cross-sectional view, showing SiGe film 4, which includes layer L2 4'A, and layer L1, 4'B.

In some embodiments, the inventive method includes a doping the SiGe film with boron step which includes doping L2 with boron, but does not include doping L1 with boron. For example, in some embodiments, L1 and L2 are epitaxially grown, and L2 is boron-doped in situ, but L1 is not.

In some embodiments, the inventive method includes doping both L1 and L2. In some embodiments, both L1 and L2 are doped in situ.

In some embodiments, the inventive method of forming a pMOSFET does not include constant boron doping of the SiGe film. Accordingly, in some embodiments, the inventive method yields a SiGe film, the boron doping profile of which is not flat (i.e., the boron content (concentration) of the SiGe film, where present, is continually increasing). As used herein, "constant boron doping" refers to doping a SiGe film with a substantially constant boron concentration. A "substantially constant" boron concentration is one that deviates less than 10% from the average boron doping concentration. By way of example, FIG. 3 depicts the result of substantially constant boron doping. There, constant doping results in a straight, horizontal doping profile, where boron concentration deviates, from 0 to about 32 nm into the SiGe, 0% from the average boron doping concentration.

In some embodiments, the inventive method of forming a pMOSFET does not include hydrogenating the SiGe film. Accordingly, in such embodiments, the SiGe film is not hydrogenated.

In some embodiments, the inventive method of forming a pMOSFET does not include separating the SiGe film from the silicon substrate.

In another aspect, the invention provides a pMOSFET, which includes a SiGe film, said SiGe film having a lower interface in contact with a semiconductor substrate and an upper surface, and said SiGe film having a graded boron doping profile where boron content increases upwardly over a majority of the width of boron-doped SiGe film between the lower interface of the SiGe film and the upper surface of the SiGe film.

The inventive pMOSFET may be formed using the inventive method of forming a pMOSFET. Thus, the properties of SiGe films described above in reference to the inventive method are properties which embodiments of the inventive pMOSFET itself may have. Similarly, the inventive methods discussed above may include any steps to form the pMOSFET's described herein.

As discussed above, in some embodiments, the invention provides a pMOSFET wherein the SiGe film includes (or in some embodiments, consists of) a lower SiGe layer (L1) adjacent to the lower interface and an upper SiGe layer (L2) adjacent to the upper surface, where L1 is in direct contact with L2, and wherein L2 contains more boron than L1. In some embodiments, only L2 contains boron. In other embodiments, L1 and L2 contain boron. Prior art pMOSFET fabrication processes typically do not include a process step for boron-doping L1.

Where a SiGe film is considered to have layers L1 and L2 present, the thickness of L1 and L2 may be the same, or different. In some embodiments, L1 an L2 have a thicknesses that are each 100 nm or less. For example, L1 and L2 may have thicknesses that are individually selected from 2-100 nm, for example, from 2, 5, 10, 15, 20, 25, 30, 35, 40, 45, 50, 55, 60, 65, 70, 75, 80, 85, 90, 95, or 100 nm, including any and all ranges and subranges therein (e.g., 2-50 nm). In some embodiments, L1 has a thickness of less than 50 nm. In some embodiments, L2 has a thickness of less than 50 nm. In some embodiments, L1 and L2 have a combined total thickness of 75 nm or less.

In some embodiments, the graded boron doping profile in the SiGe layer of the inventive pMOSFET reflects a graded boron concentration increase from $1\times10^{19}$ atoms of boron per $cm^3$ or less to at least $2\times10^{20}$ atoms of boron per $cm^3$ (e.g., to at least $3\times10^{20}$ atoms of boron per $cm^3$ or to at least $4\times10^{20}$ atoms of boron per $cm^3$, or to at least $5\times10^{20}$ atoms of boron per $cm^3$ or to at least $6\times10^{20}$ atoms of boron per $cm^3$, or to at least $7\times10^{20}$ atoms of boron per $cm^3$ or to at least $8\times10^{20}$ atoms of boron per $cm^3$).

In some pMOSFET embodiments, the slope of the graded boron doping profile increases linearly. In some embodiments, the slope of the graded boron doping profile increases logarithmically.

In some embodiments, the upper surface of the SiGe film has a boron concentration of $1\times10^{19}$ atoms of boron per $cm^3$ to $1\times10^{22}$ atoms of boron per $cm^3$, including any and all ranges and subranges therein. In some embodiments, the SiGe film of the invention has a boron concentration, at the upper surface of the film, of more than $1\times10^{19}$ atoms of boron per $cm^3$. In some embodiments, the upper surface of the SiGe film has a boron concentration of more than $1\times10^{20}$ atoms of boron per $cm^3$ (e.g., more than $2\times10^{20}$ atoms of boron per $cm^3$), In another aspect, the invention provides a semiconductor device which includes the inventive pMOSFET.

EXAMPLES

The invention will now be illustrated, but not limited, by reference to the specific embodiments described in the following examples.

Figure 5:
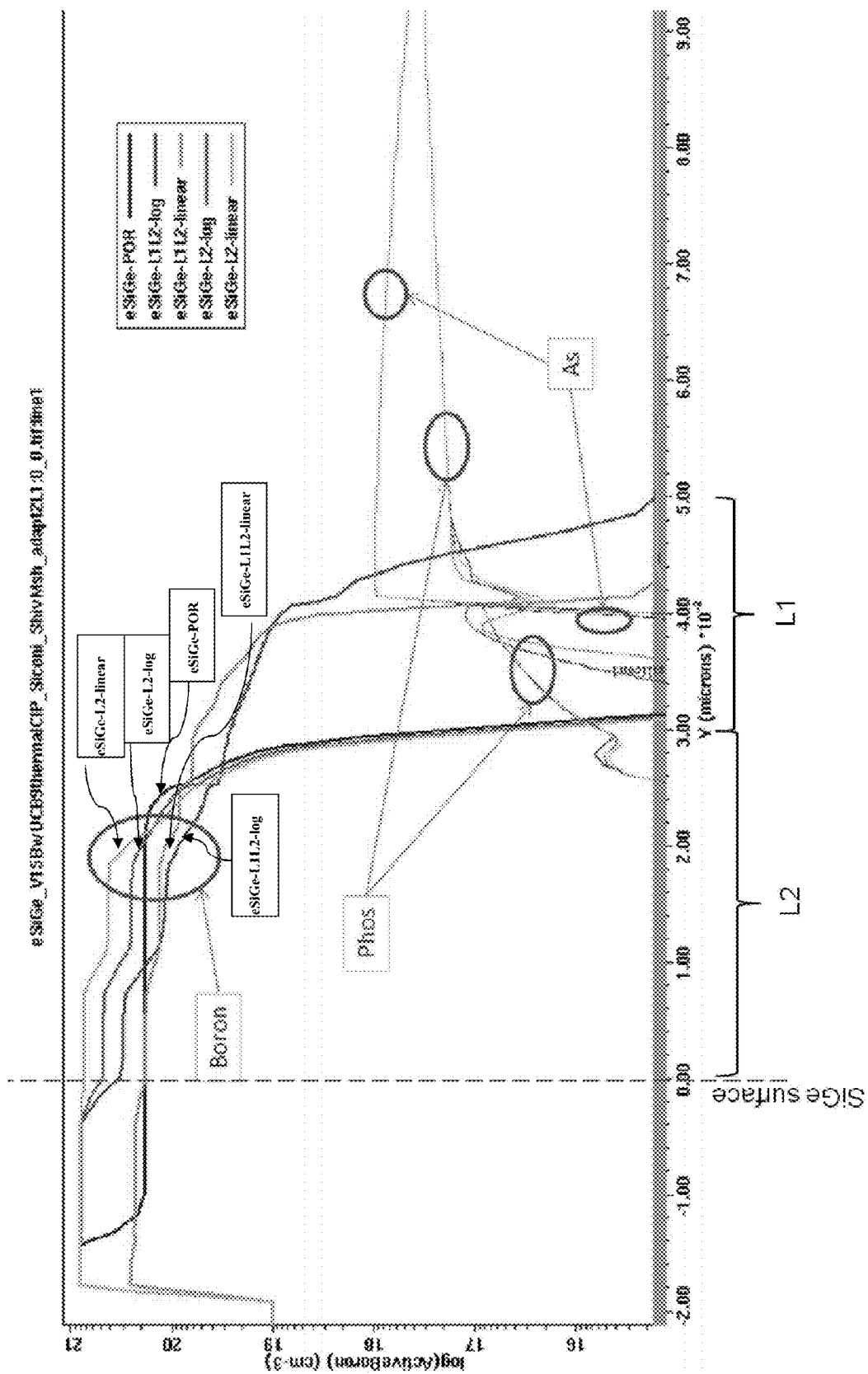
FIG. 5 is a chart that illustrates final boron doping profiles from simulation testing.

Simulation testing is done using a well calibrated deck for 20 nm technology. The simulation is based on pMOSFET's having a 50 nm thick SiGe film, where L1 (the initially-deposited SiGe) is about 20 nm thick, and L2 (the upper portion of the SiGe) is about 30 nm thick. Common parameters are shared for all testing, except that SiGe films have different boron doping profiles. FIG. 5 is a chart that illustrates the final boron doping profiles from the simulation testing. Referring to the x axis of the chart in FIG. 5 (which provides depth (or width), in micron×$10^{-2}$), the SiGe film width spans from 0.00 (which represents the SiGe upper surface) to 5.00, which represents the lower interface of the SiGe, which is in contact with a semiconductor substrate. The area to the left of 0.00 represents the contact region of the pMOSFET. The y axis in FIG. 5 provides the concentration of boron atoms.

As can be seen, FIG. 5 includes boron doping profiles (1), not according to the invention, and (2)-(4), according to embodiments of the invention. In particular, FIG. 5 includes: (1) a POR constant boron doping profile, where only L2 is boron doped ("eSiGe-POR" plot); (2) a linearly graded boron doping profile where only L2 is boron doped ("eSiGe-L2-linear" plot); (3) a linearly graded boron doping profile where L1 and L2 are both boron-doped ("eSiGe-L1L2-linear" plot); (4) a logarithmic graded boron doping profile where only L2 is boron doped ("eSiGe-L2-log" plot); and (5) a logarithmic graded boron doping profile where L1 and L2 are both doped ("eSiGe-L1-L2-log" plot). The boron-doping step for doping the SiGe films uses boron-containing gas, and the inventive embodiments of FIG. 5 have graded boron doping profiles that are achieved by controlling gas flow rate. Profiles (1)-(5) reflect final doping profiles that are obtained after all thermal budget where dopants diffuse.

Figure 6A:
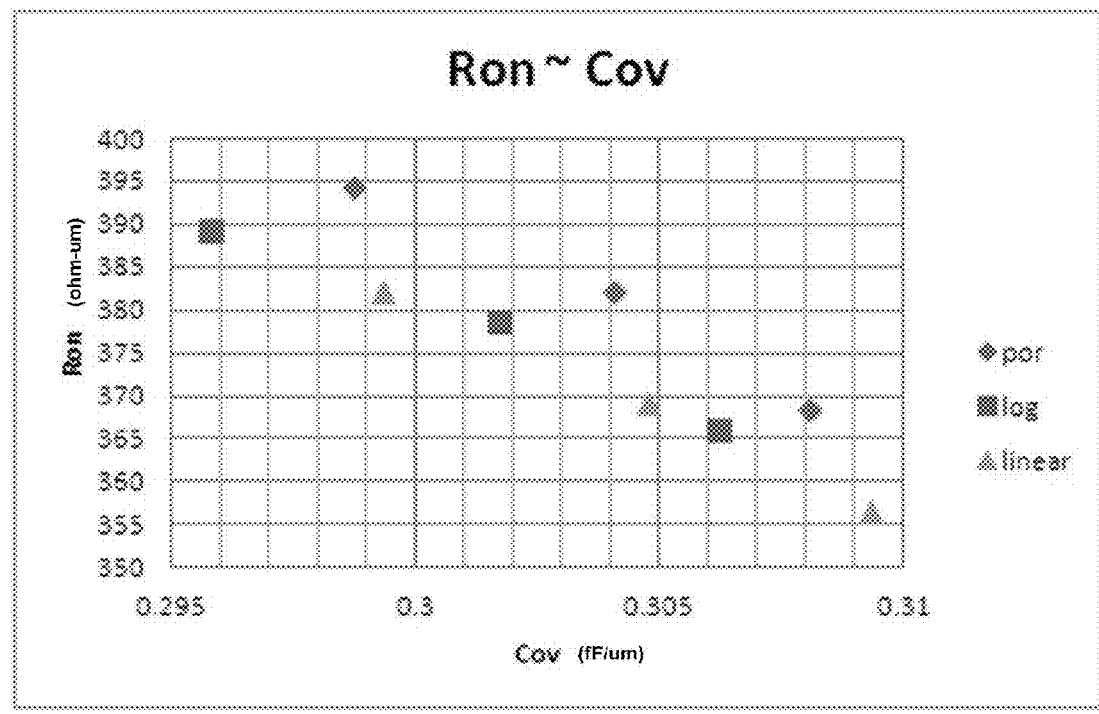
FIGS. 6A-B are charts showing Ron (resistance of device) and Cov (overlap capacitance) performance for pMOSFET's with SiGe layers having different boron doping profiles.
Figure 6B:
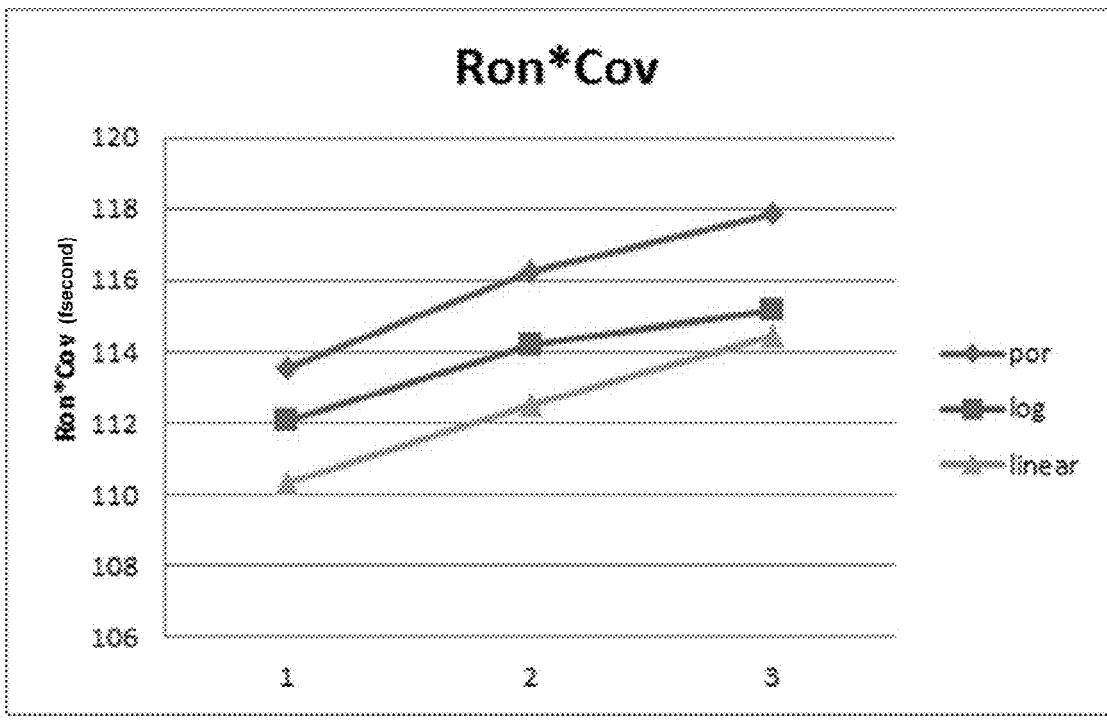
Figure 7A:
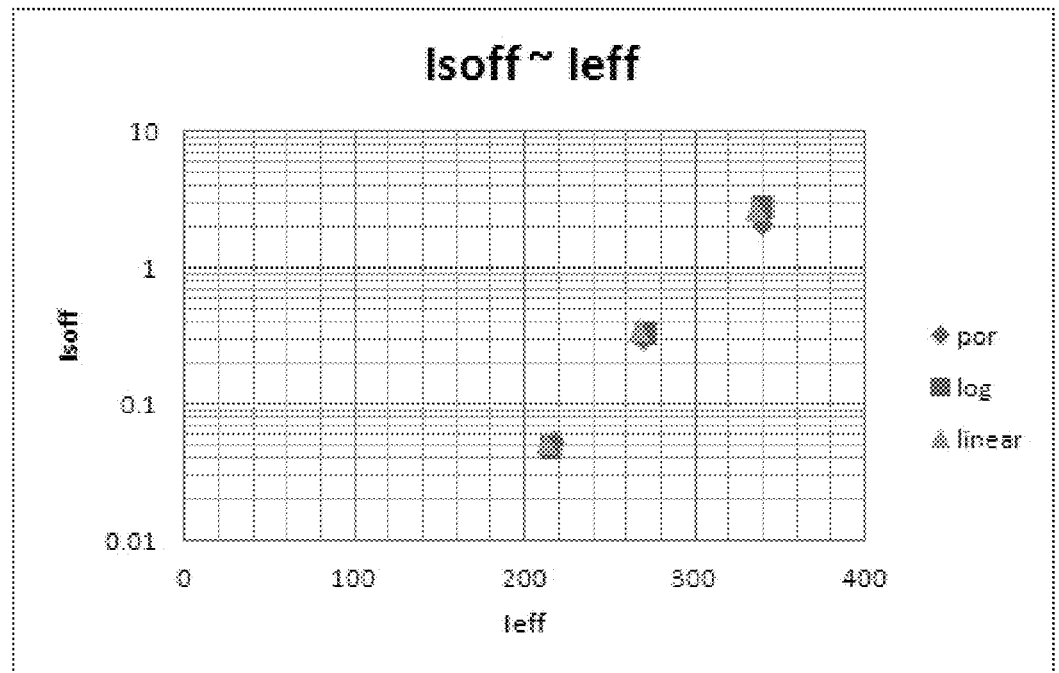
FIGS. 7A-E are charts showing other electrical performance comparisons as between pMOSFET's with SiGe layers having different boron doping profiles.
Figure 7B:
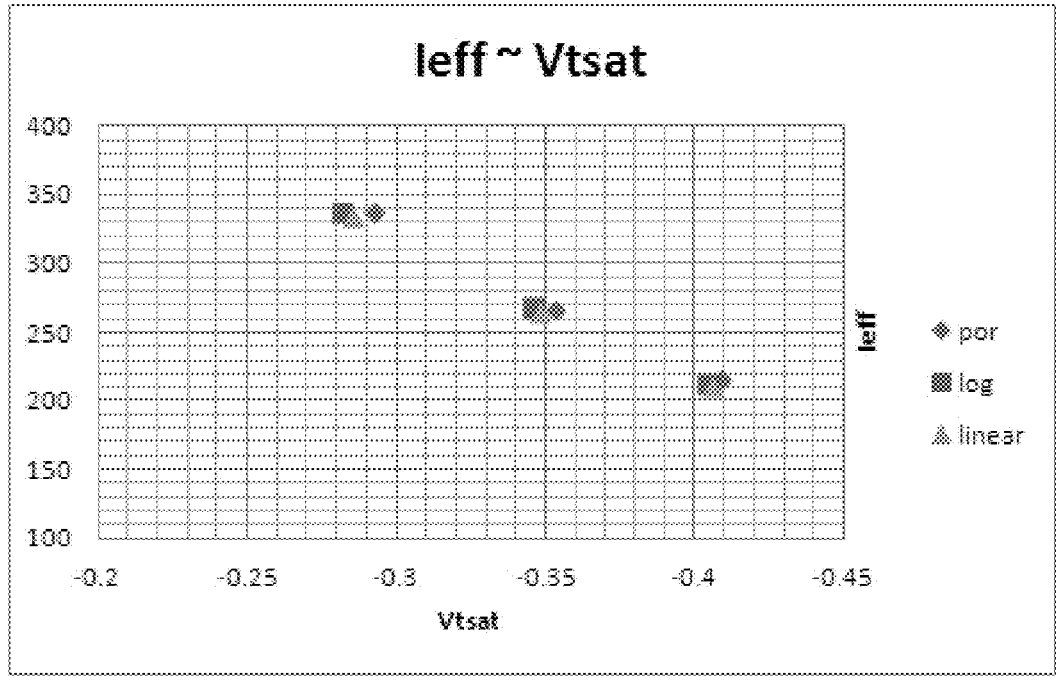
Figure 7C:
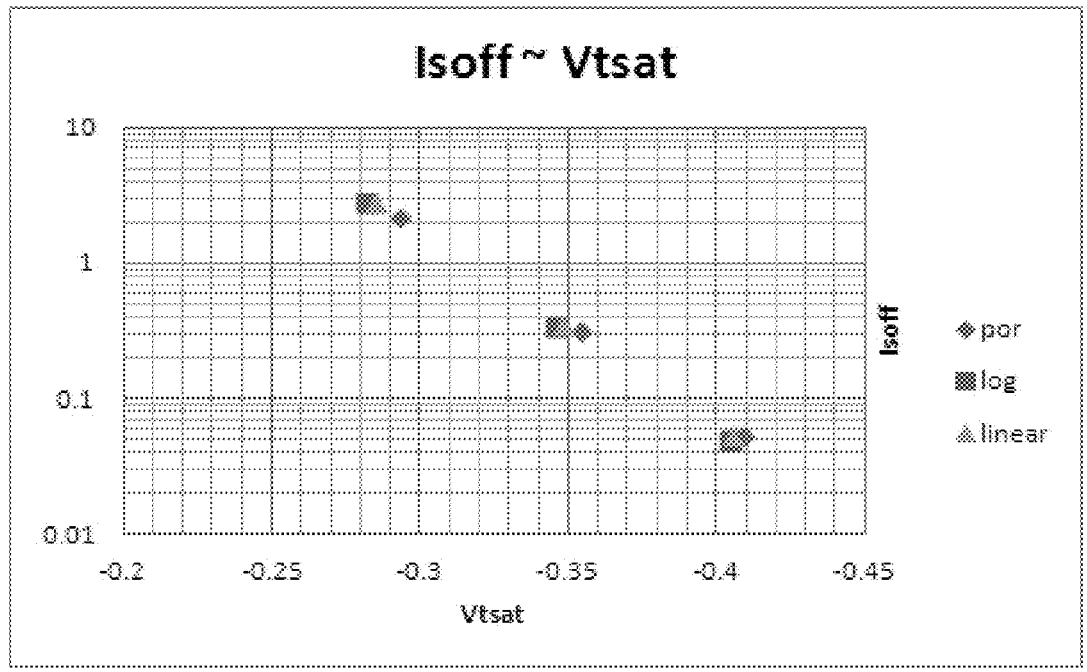
Figure 7D:
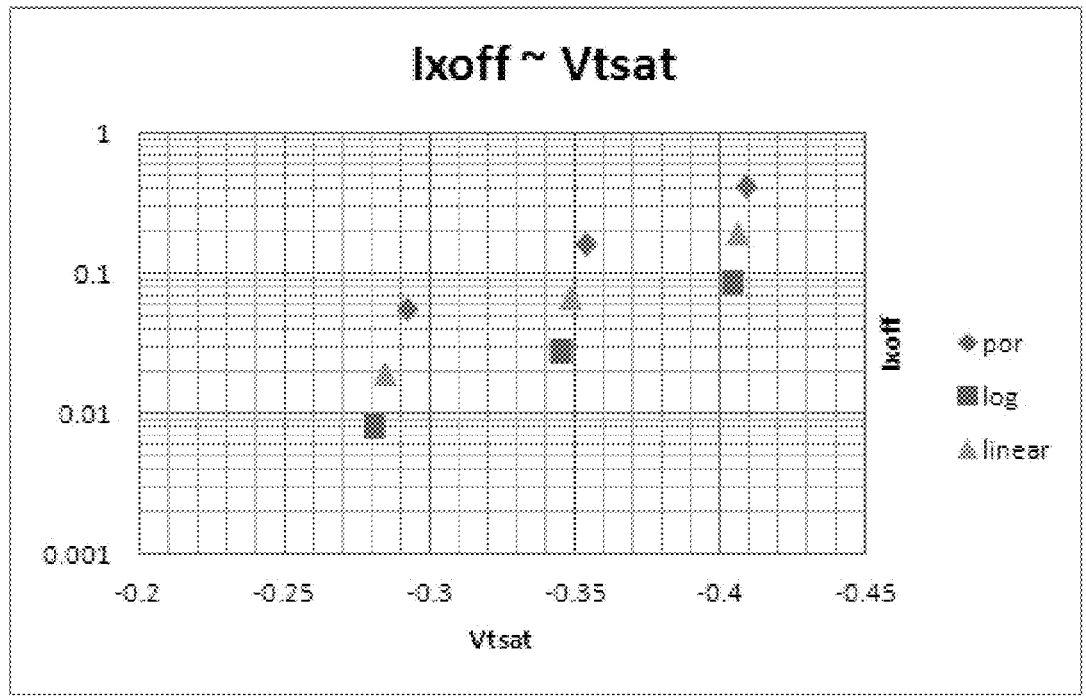
Figure 7E:
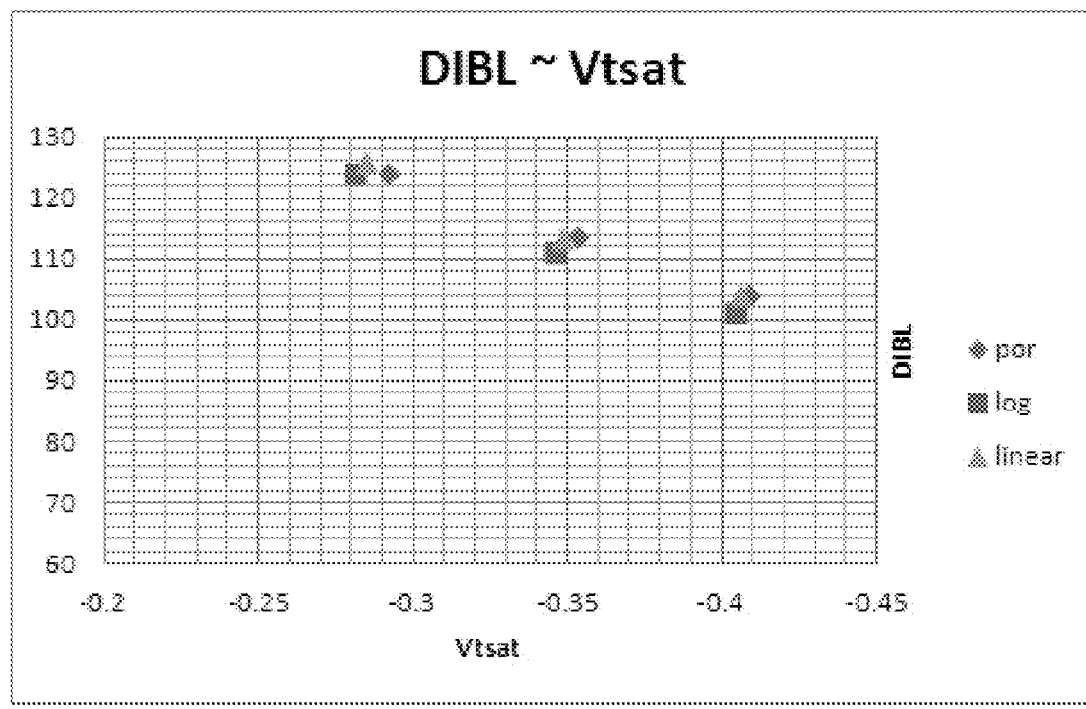
Figure 8A:
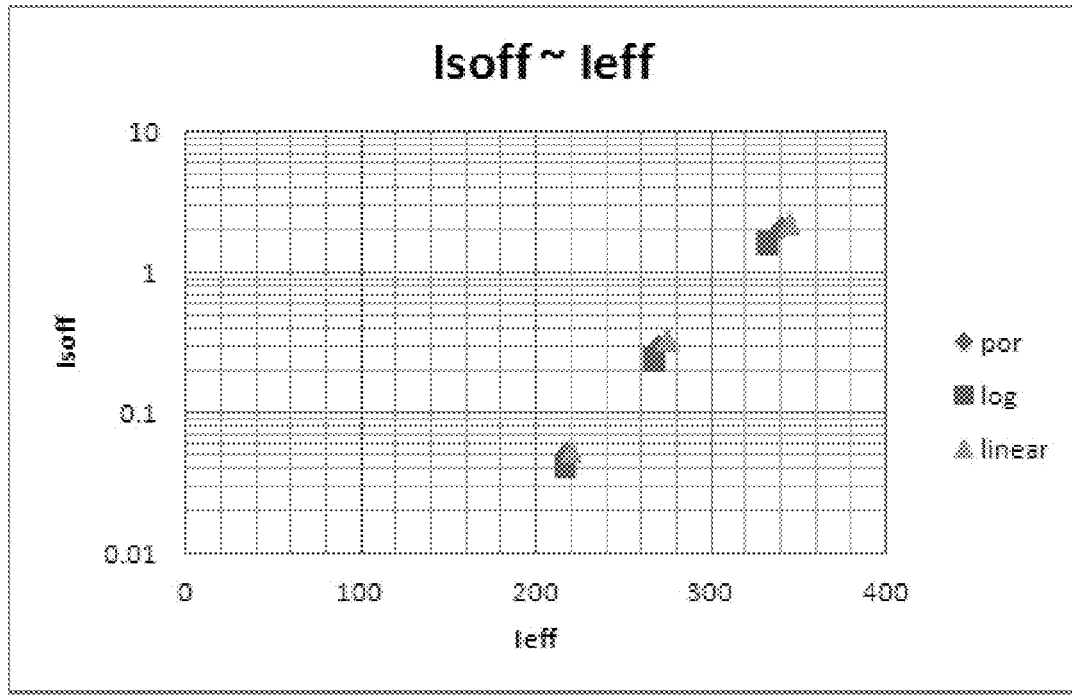
FIGS. 8A-E are charts showing other electrical performance comparisons as between pMOSFET's with SiGe layers having different boron doping profiles.
Figure 8B:
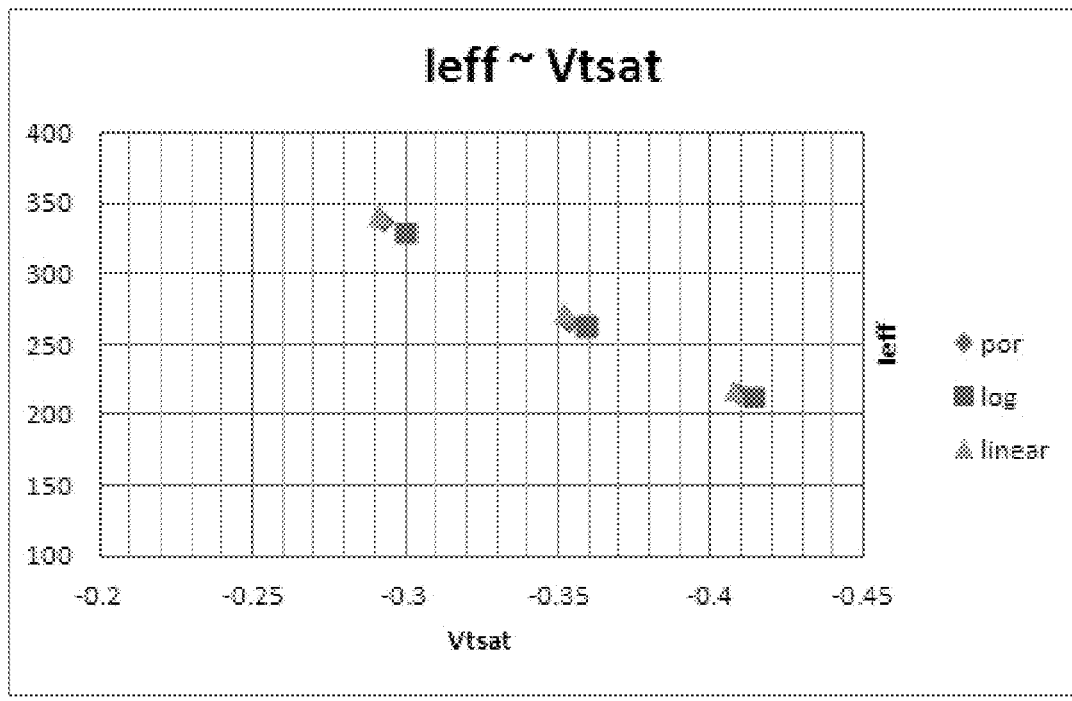
Figure 8C:
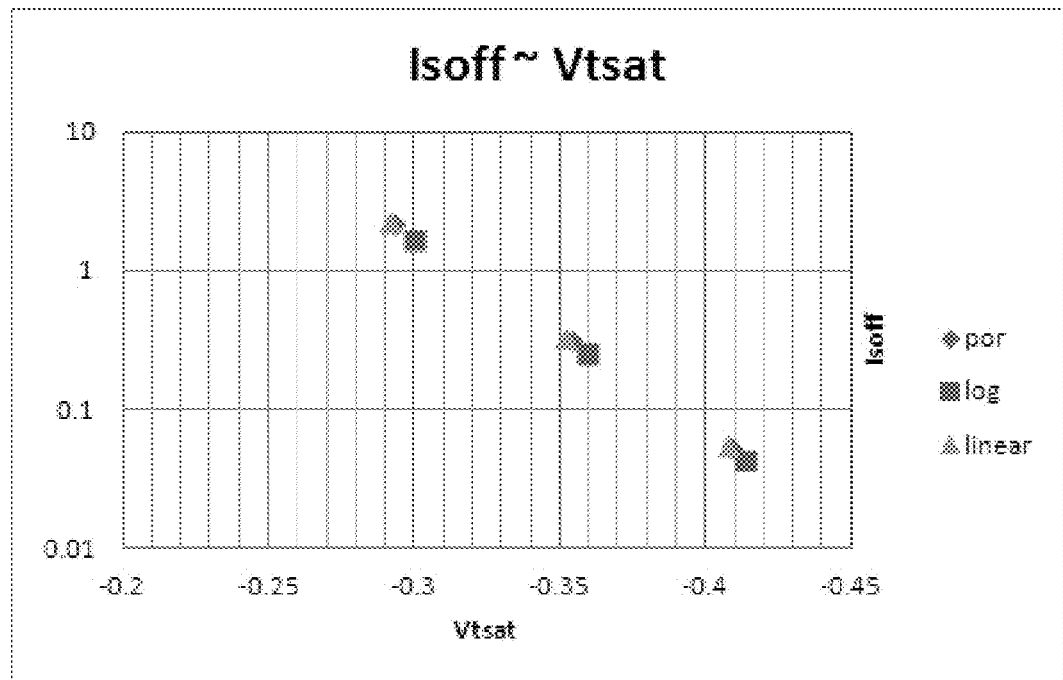
Figure 8D:
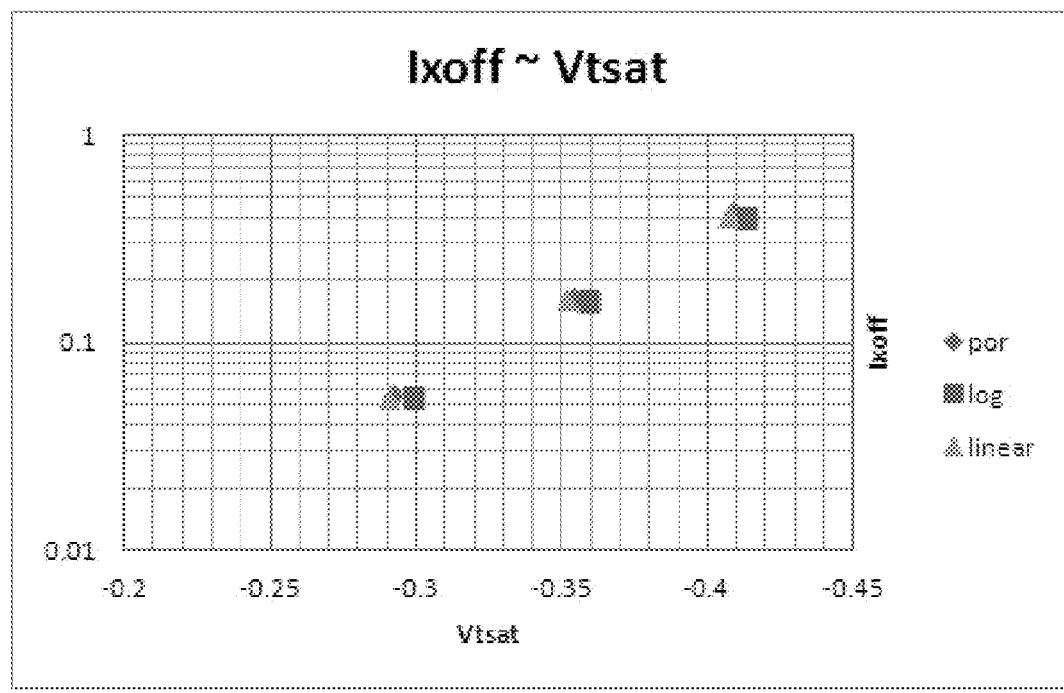
Figure 8E:
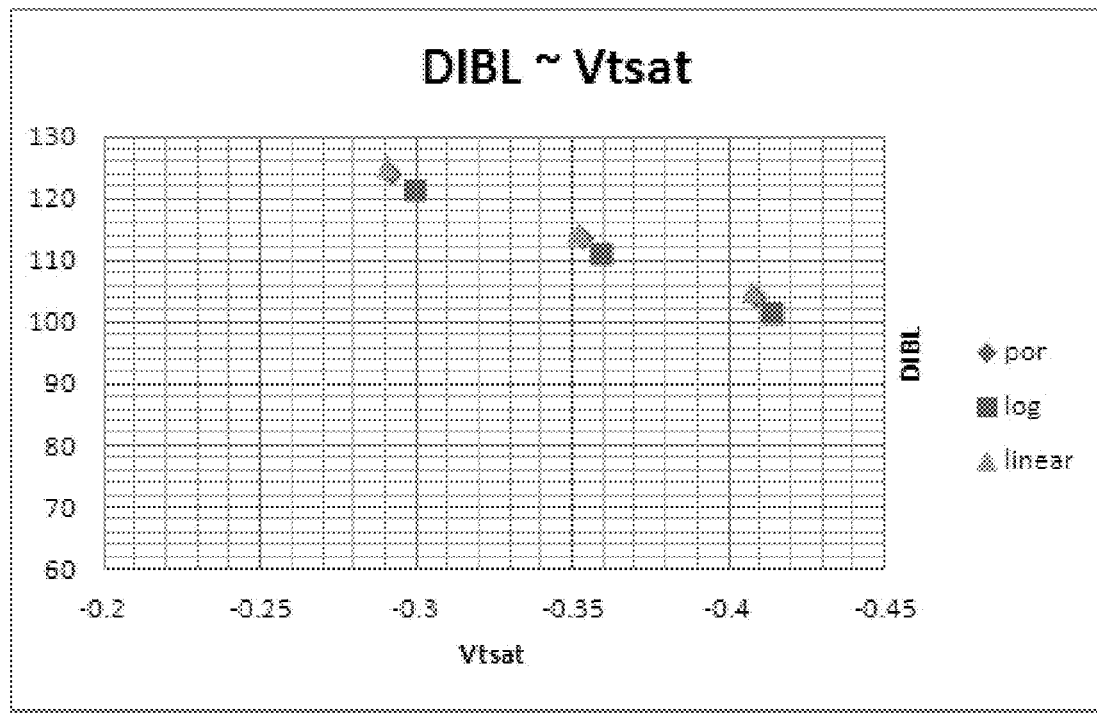

FIGS. 6A-B are charts showing Ron (resistance of device when it's on) and Cov (overlap capacitance) performance for pMOSFET's with SiGe layers having POR constant boron doping (in L2 only), corresponding to profile (1) discussed in relation to FIG. 5 above, and logarithmic and linear doping (in L2 only), corresponding to embodiments of the invention and to profiles (4) and (2) discussed above in relation to FIG. 5, respectively.

As shown in FIG. 6A, logarithmic and linear profiles (4) and (2) show better Cov performance as compared to POR (1). For a given Cov, the Ron is lower for the log and linear according to embodiments of the invention, as opposed to the POR. Likewise, for linear and log, at any given Ron, the Cov is lower than for the POR.

As shown in FIG. 6B, Ron*Cov, is lowest for graded (here, log and linear) boron doping profiles as compared to that of constant boron doping used in the standard POR process.

FIGS. 7A-E are charts showing other electrical performance comparisons as between pMOSFET's with SiGe layers having POR constant boron doping (in L2 only), corresponding to profile (1) discussed in relation to FIG. 5 above, and logarithmic and linear doping (in L2 only), corresponding to embodiments of the invention and to profiles (4) and (2), respectively, discussed above in relation to FIG. 5.

The following terms are used in FIGS. 7A-E and FIGS. 8A-E, and have the following meanings: Isoff—standby current; Ieff (I-effective; the effective current coming from the transistor); Ixoff—junction leakage; Vtsat=vt of transistor in saturation; DIBL—drain induced barrier lowering.

As evident from FIGS. 7A-E, embodiments of the invention having a graded boron doping profile in L2 demonstrate better or comparable electrical performance than the constant-boron-doped POR profile.

FIGS. 8A-E are charts showing other electrical performance comparisons as between pMOSFET's with SiGe layers having POR constant boron doping (in L2 only), corresponding to profile (1) discussed in relation to FIG. 5 above, and logarithmic and linear doping (in L1 and L2), corresponding to embodiments of the invention and to profiles (5) and (3), respectively, discussed above in relation to FIG. 5. As evident from FIGS. 8A-E, embodiments of the invention having a graded boron doping profile in L1 and L2 demonstrate better or comparable electrical performance than the constant-boron-doped POR.

FIGS. 6A-B, 7A-E, and 8A-E thus demonstrate that graded boron doping of the SiGe film in accordance with the present invention results in improved overlap capacitance (Cov) without negative impact on other transistor parameters or electrical performance. The graded boron doping of the present invention leads to a gain on AC performance without degrading any device performance, thereby enabling better device performance by, e.g., reducing overlap capacitance and junction leakage, thus resulting on overall better chip performance.

These results are counterintuitive to one skilled in the art, as it is known in the art that increasing boron content in SiGe, more than POR concentration, can severely degrade device performance. Based on this knowledge, one typically would not wish to increase boron content.

Figure 9:
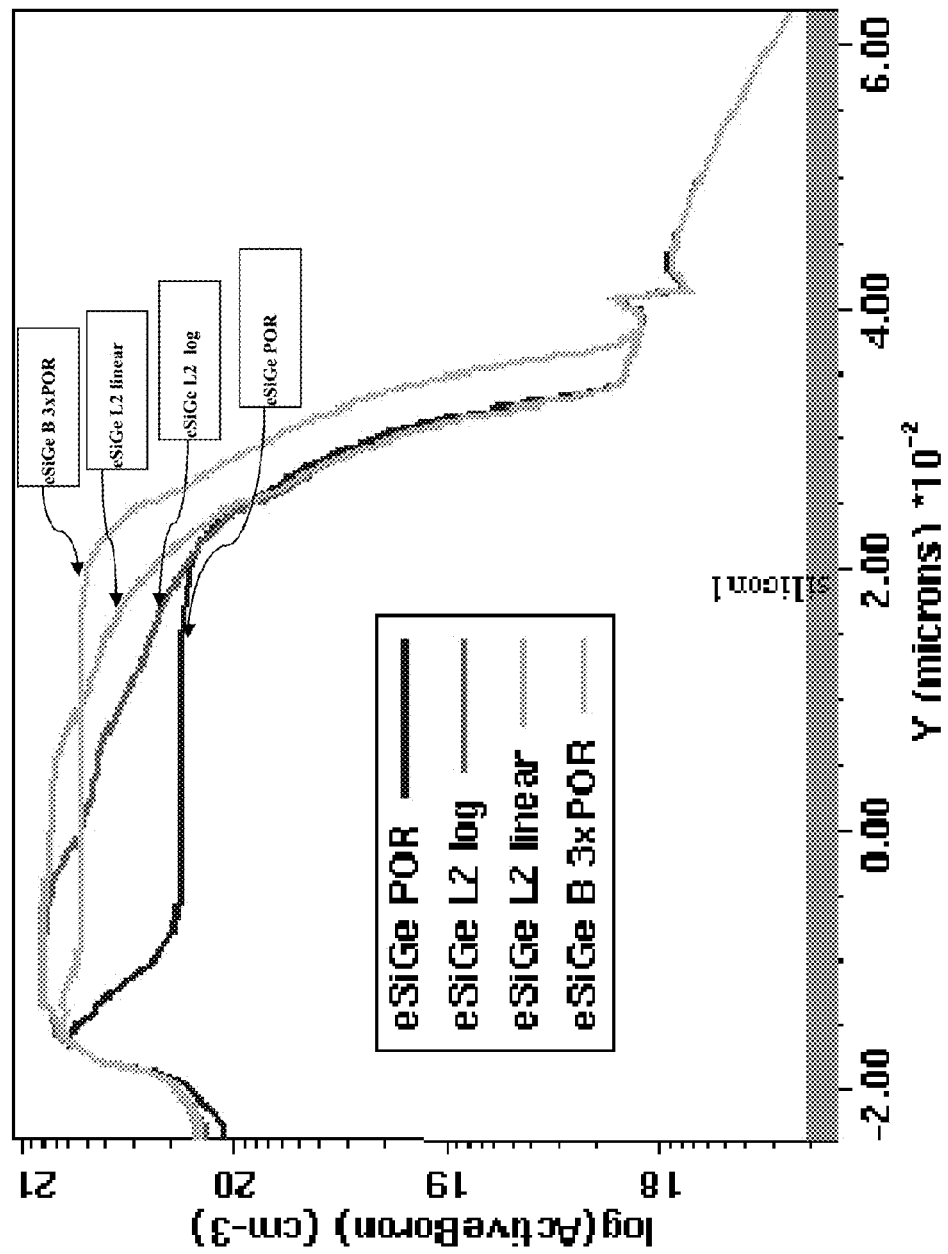
FIG. 9 is a chart that illustrates final boron doping profiles from simulation testing.

FIG. 9 is a chart that illustrates final boron doping profiles from simulation done using a well calibrated deck for 20 nm technology. The simulated profiles are based on pMOSFET's having a 50 nm thick SiGe film, where L1 (the initially-deposited SiGe) is about 20 nm thick, and L2 (the upper portion of the SiGe) is about 30 nm thick. Common parameters are shared for all testing, except that SiGe films have different boron doping profiles. As in FIG. 5, in FIG. 9, the SiGe film width spans from 0.00 (which represents the SiGe upper surface) on, with L2 spanning from 0.00 (which represents the upper surface) to 3.00. FIG. 9 includes log and linear L2 boron doping profiles according to embodiments of the present invention, as well as an L2 constant boron doping profile ("eSige-POR"), not according to the invention. FIG. 9 also includes a constant boron doping profile (also not according to the invention) that represents constant doping at three times the boron concentration used in the POR. This plot is shown as "eSiGe-POR(L2×3)".

Figure 10A:
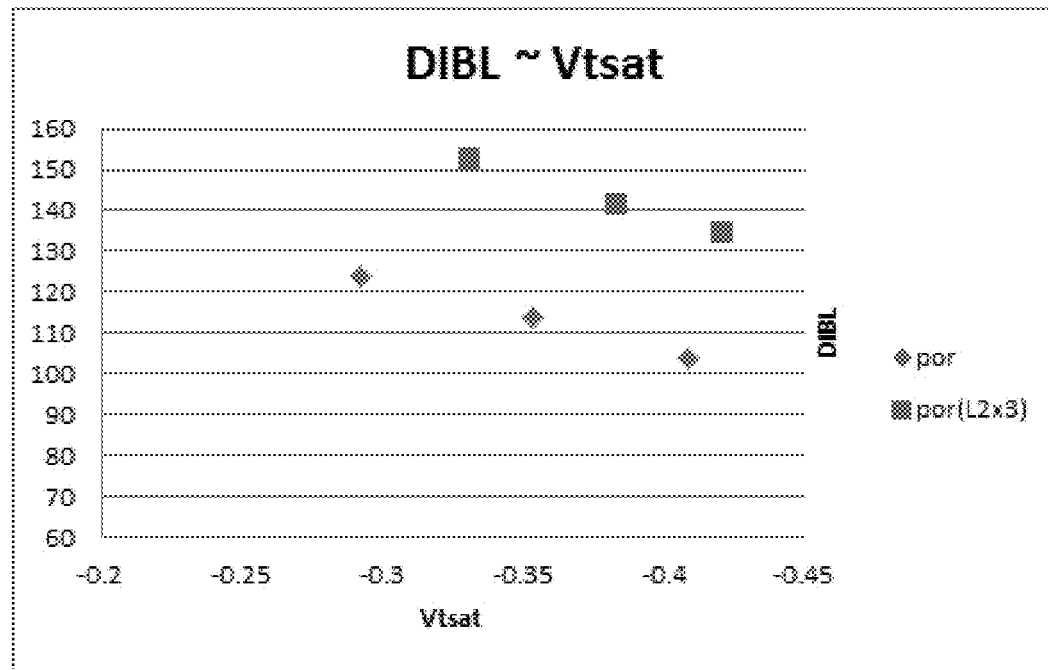
FIGS. 10A-C are charts showing comparative electrical parameters for a pMOSFET with SiGe film having POR constant boron doping, and for a pMOSFET with SiGe film that was constant boron doped, but at a boron concentration of three times that used in the POR.
Figure 10B:
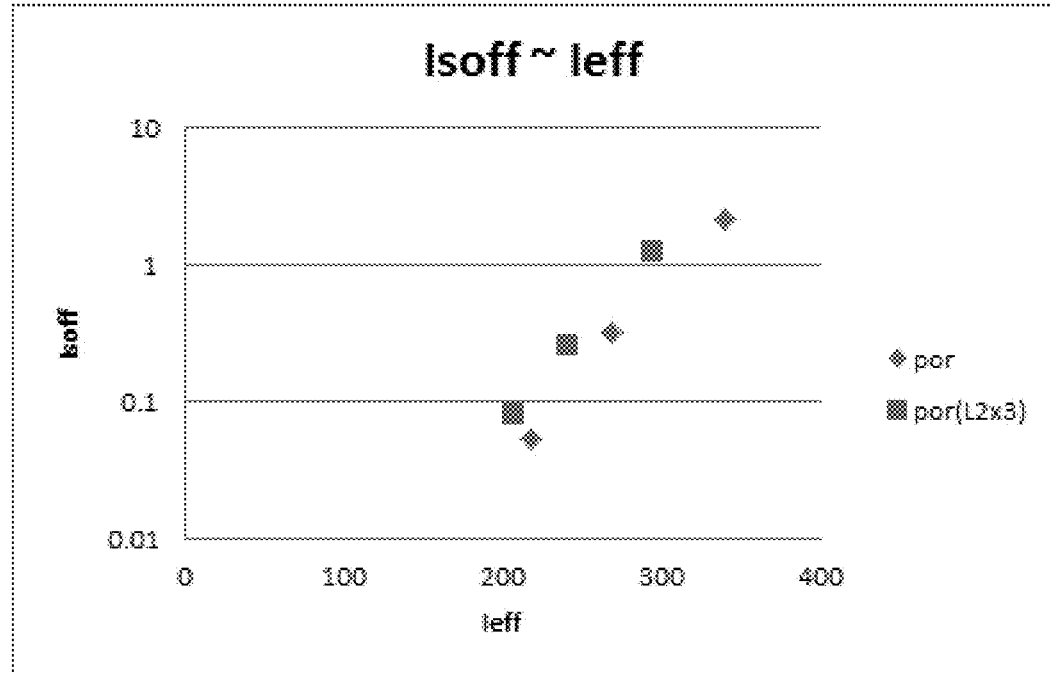
Figure 10C:
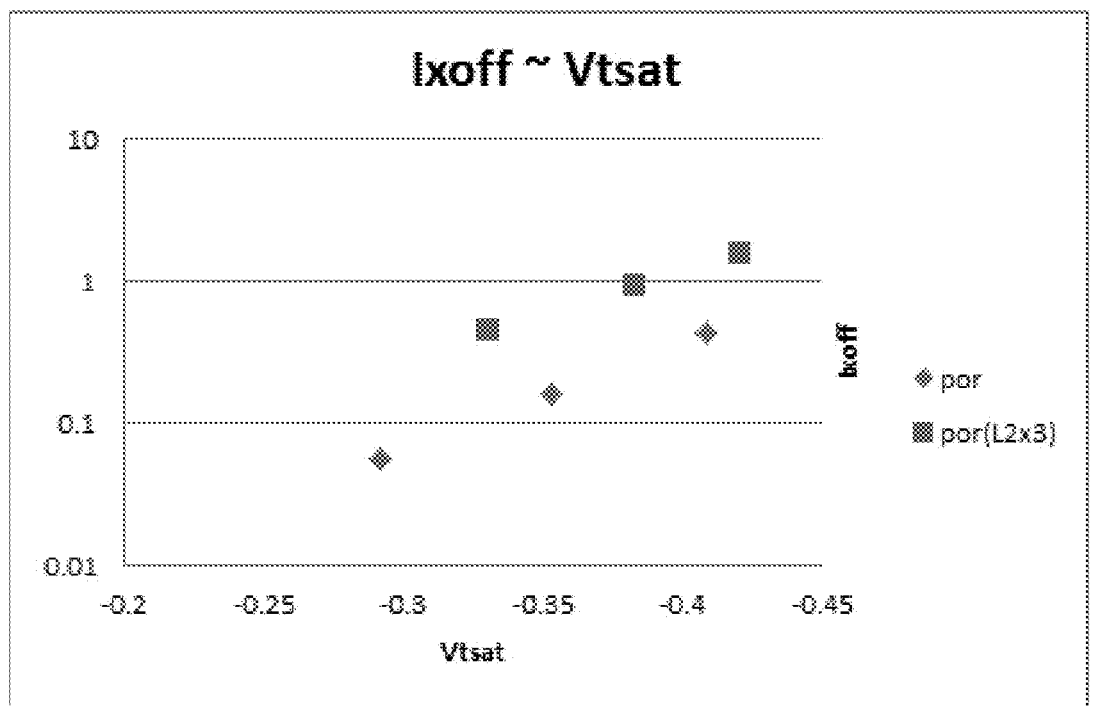

FIGS. 10A-C are charts showing comparative electrical parameters for a pMOSFET with SiGe film having POR constant boron doping ("por"), which corresponds to the "eSige-POR" plot from FIG. 9, and for a pMOSFET with SiGe film that was constant boron doped, but at a boron concentration of three times that used in the POR ("por(L2×3)"), which corresponds to the "eSige-POR(L2×3)" plot from FIG. 9. The charts of FIGS. 10A-C illustrate that merely increasing boron concentration degrades device performance.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "comprising" and "including" or grammatical variants thereof are to be taken as specifying the stated features, integers, steps or components but do not preclude the addition of one or more additional features, integers, steps, components or groups thereof. This term encompasses the terms "consisting of" and "consisting essentially of".

The phrase "consisting essentially of" or grammatical variants thereof when used herein are to be taken as specifying the stated features, integers, steps or components but do not preclude the addition of one or more additional features, integers, steps, components or groups thereof but only if the additional features, integers, steps, components or groups thereof do not materially alter the basic and novel characteristics of the claimed composition, device or method.

Where one or more ranges are referred to throughout this specification, each range is intended to be a shorthand format for presenting information, where the range is understood to encompass each discrete point within the range as if the same were fully set forth herein.

While several aspects and embodiments of the present invention have been described and depicted herein, alternative aspects and embodiments may be affected by those skilled in the art to accomplish the same objectives. Accordingly, this disclosure and the appended claims are intended to cover all such further and alternative aspects and embodiments as fall within the true spirit and scope of the invention.

The invention claimed is:

1. A method of forming a p-type metal-oxide semiconductor field-effect transistor (pMOSFET) comprising:
   providing a semiconductor substrate;
   depositing a silicon-germanium (SiGe) film on the semiconductor substrate, thereby forming a lower interface of the SiGe film in contact with the semiconductor substrate, and an upper surface of the SiGe film; and
   doping the SiGe film with boron to form a SiGe film having a continually increasing graded boron doping profile reflecting a graded boron concentration increase from $1\times10^{19}$ atoms of boron per cm$^3$ or less to at least $4\times10^{20}$ atoms of boron per cm$^3$, where boron content continually increases upwardly over a majority of the width of boron-doped SiGe film between the lower interface of the SiGe film and the upper surface of the SiGe film, wherein said doping the SiGe film with boron comprises using a boron-containing gas, wherein the graded boron doping profile of the SiGe film is achieved by controlling gas flow rate of the boron-containing gas while epitaxially growing the SiGe film, and wherein the gas flow rate is increased logarithmically.

2. The method according to claim 1, wherein the SiGe film comprises a lower SiGe layer (L1) adjacent to the lower interface of the SiGe film and an upper SiGe layer (L2) adjacent to the upper surface of the SiGe film, where L1 is in direct contact with L2, and wherein L2 comprises more boron than L1, and wherein said depositing a silicon-germanium (SiGe) film comprises forming L1, and subsequently forming L2.

3. The method according to claim 2, wherein L1 is not doped with boron.

4. The method according to claim 2, wherein L1 and L2 are both doped with boron.

5. The method according to claim 1, comprising doping the SiGe film with boron to form a SiGe film having a graded boron doping profile spanning at least 15 nm of the SiGe film.

\* \* \* \* \*